United States Patent [19]

Acocella et al.

[11] Patent Number: 5,031,029
[45] Date of Patent: Jul. 9, 1991

[54] COPPER DEVICE AND USE THEREOF WITH SEMICONDUCTOR DEVICES

[75] Inventors: John Acocella, Hopewell Junction, N.Y.; Nanik Bakhru, Danbury, Conn.; Alfred Grill, Ossining, N.Y.; Egidio Marotta, Poughkeepsie, N.Y.; Bernard S. Meyerson; Vishnubhai V. Patel, both of Yorktown Heights, N.Y.

[73] Assignees: International Business Machines Corporation, Armonk, N.Y.

[21] Appl. No.: 504,496

[22] Filed: Apr. 4, 1990

[51] Int. Cl.[5] .................. H01L 39/02; H01L 23/48
[52] U.S. Cl. ........................... 357/81; 357/81; 357/71; 165/905; 165/865
[58] Field of Search ............. 357/81, 2, 71, 23.15, 357/91, 68; 165/905, 865

[56] References Cited

U.S. PATENT DOCUMENTS

| | | | |
|---|---|---|---|
| 4,647,494 | 3/1987 | Meyerson et al. | 428/216 |
| 4,665,415 | 5/1987 | Esaki et al. | 357/23.1 |
| 4,728,626 | 3/1988 | Tu | 357/60 |
| 4,770,242 | 9/1988 | Duikaku et al. | |
| 4,809,044 | 2/1989 | Pryor et al. | 357/81 |
| 4,819,037 | 4/1989 | Sakakibara et al. | 357/23.4 |
| 4,849,856 | 7/1989 | Funari et al. | 361/386 |

OTHER PUBLICATIONS

Yea, "Bump Internal-Thermal Enhancement", IBM Technical Disclosure Bulletin, vol. 27, No. 7B, Dec. 1984, pp. 4413-4415.

Meyerson et al., Electrical and Optical Properties of Hydrogenated Amorphous Carbon Films, Journal of Non-Crystalline Solids, 35 & 36 (1980) pp. 435-440, North-Holland Publishing Company.

Primary Examiner—Jerome Jackson, Jr.
Assistant Examiner—C. Whitehead, Jr.
Attorney, Agent, or Firm—Pollock, Vande Sande & Priddy; Pollock, Vande Sande & Priddy

[57] ABSTRACT

A device that contains a copper substrate; a rigidizing layer and/or a metal layer, and a non-graphitic hard carbon layer deposited on the rigidizing layer; and use as a heat sink or piston for electronic components.

20 Claims, 1 Drawing Sheet

COPPER DEVICE AND USE THEREOF WITH SEMICONDUCTOR DEVICES

DESCRIPTION

1. Technical Field

The present invention is concerned with a copper device and especially a copper device suitable as a heat sink for cooling of electronic components such as integrated circuit chips. Moreover, the present invention is concerned with a copper device that not only has high heat conductance but also possesses relatively high electrical resistivity.

2. Background Art

During use, various electrical components generate heat, and for proper functioning it is necessary to remove the heat.

Various methods have been suggested to accomplish this heat transfer away from the electrical components including integrated circuit modules. Such modules usually include a cap to protect the integrated circuit chip from the atmosphere. Typically, the cap employed for the purpose of dissipating heat is aluminum and when the aluminum is to be in contact with the electrical component such is anodized to provide an aluminum oxide layer to act as electrical isolation.

Furthermore, there have been various suggested configurations for providing for the conduction of heat from the electrical component (e.g.—chip) to the cap whereafter the heat is dissipated into the ambient surroundings. By way of example, see U.S. Pat. Nos. 4,849,856 and 4,770,242 and Yeh, "Bump Internal-Thermal Enhancement", IBM-Technical Disclosure Bulletin, Vol. 27, No. 7B, December 1984, pp. 4413–4415.

Although, aluminum has been quite satisfactory as a heat sink for electronic devices, as the power demands of devices increase, the heat dissipating ability of aluminum may not be entirely adequate.

SUMMARY OF INVENTION

The present invention provides a device that exhibits significantly higher cooling capacity than aluminum heat sinks now in use. Furthermore, the present invention provides a device that exhibits relatively high electrical resistance, such as at least 10 Mohms over a contact area of 0.5 cm$^2$ at a potential of about 10 volts (D.C.).

In particular, according to one aspect of the present invention there is provided a device that includes a copper substrate, a metal layer on the substrate wherein the metal layer is nickel, chromium (hereinafter chrome), cobalt or titanium; and a non-graphitic hard carbon layer deposited on the metal layer. The metal layer is about 500 to 2000 angstroms thick and the carbon layer is about 0.2 to about 2 microns thick.

According to another aspect of the present invention is provided a device that includes a copper substrate, a rigidizing layer deposited on the copper substrate; and a non-graphitic hard carbon layer deposited on the rigidizing layer. The rigidizing layer is about 2 to about 10 microns thick.

The present invention is also concerned with use of the above device containing the rigidizing layer as a heat sink for an integrated circuit chip. In particular, the device of the present invention is placed in physical contact with the backside of the chip, with the carbon layer being in contact with the backside of the chip.

BEST AND VARIOUS MODES FOR CARRYING OUT INVENTION

Figure 1:
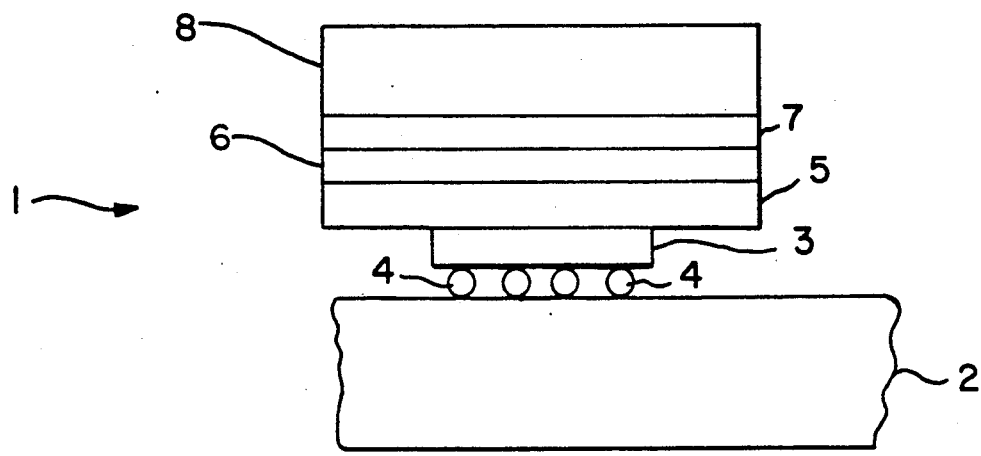
FIG. 1 is a schematic diagram of a device pursuant to the present invention.

FIG. 1 illustrates one type of electronic package pursuant to the present invention. In general, the structure (1) includes a substrate (2) on which is mounted an integrated circuit chip (3) employing solder balls (4). Contacting the backside of chip (3) (i.e.—the major surface opposite from that containing the circuitry) is the hard carbon layer (5) of the device of the present invention, which layer is in turn deposited on rigidizing layer (6). Rigidizing layer (6) is deposited on silicide forming metal layer (7) which in turn is deposited onto copper substrate (8).

Figure 2:
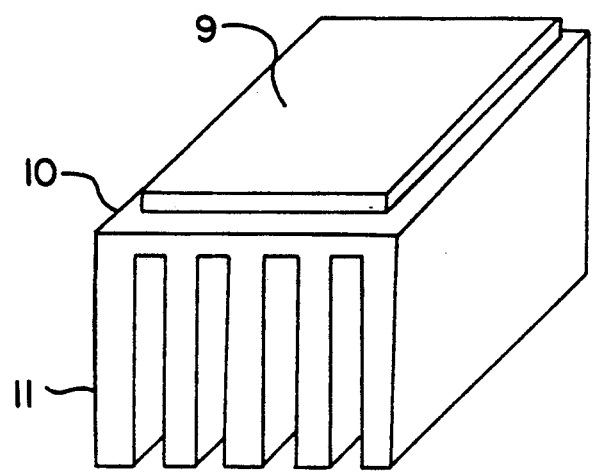
FIG. 2 is a diagram of a typical copper substrate that can be employed in the present invention.

The copper substrate (8) provides for the high thermal conductivity of the device. FIG. 2 illustrates a typical copper substrate (8) with typical dimensions shown in mm. The copper substrate in FIG. 2 is formed from a single block of copper and has a top surface (9) on a base (10) supported by downwardly extending fins (11).

In order to electrically insulate the conductive copper from the chip without a concomitant reduction in the thermal performance of the device, a layer of hard carbon is provided between the chip and copper substrate. However, since the copper is flexible and pliable, coating the carbon layer directly onto the copper would result in a product highly susceptible to cracking of the hard carbon layer.

Moreover, the carbon does not adhere tenaciously to the copper. Accordingly, pursuant to the present invention, a layer is interposed between the copper substrate and hard carbon layer to render the structure rigid and also to promote adhesion of the hard carbon layer on the copper.

It is critical pursuant to the present invention that the thickness of this rigidizing layer be about 2 to about 10 microns, preferably about 2 to about 6 microns and most preferably about 5 microns.

Suitable layers that will both reinforce the structure and serve to promote good bonding between the copper and hard carbon include tungsten, tungsten carbide, titanium nitride, aluminum nitride and preferably silicon. The most preferred rigidizing layer is amorphous silicon.

The rigidizing layer can be deposited by any known technique, such as evaporation, sputtering, or plasma deposition, with chemical vapor deposition being preferred. For instance, an amorphous hydrogenated silicon layer can be deposited by RF plasma employing silane as the source gas. The plasma deposition temperature for the silicon layer (6) in FIG. 1 is not especially critical, and can range from 150° C. to, for example, about 500° C. The most preferable temperature is in excess of 350° C. For instance, an amorphous hydrogenated silicon film, a-Si:H, can be deposited by plasma deposition from a gas mixture of 25% silane (SiH$_4$) in argon, at a flow rate of about 10 sccm (standard cubic centimeters per minute), a total pressure of 30 microns, and 30 W RF power. The deposition being continued for about 500 to about 700 minutes until the desired thickness of about 2 to about 10 microns is achieved.

During deposition, the substrate can be kept at a bias of about −50 volts (D.C.).

The hard or diamond-like carbon layer (5) in FIG. 1 is preferably deposited by plasma decomposition of a gas mixture, since this can be accomplished in the same vacuum system as the plasma deposition of the rigidizing layer (6) in FIG. 1. However, the diamond-like carbon layer (5) in FIG. 1 can be deposited by other methods, such as sputtering. The plasma source gas can be a hydrocarbon such as acetylene with the plasma containing optionally hydrogen. In order that the hard carbon films retain their amorphous nature and not become graphitic (i.e.—soft), the substrate temperature for plasma deposition of carbon layer (5) in FIG. 1 should be below 325° C. Preferably such is deposited at a temperature of about 140° to about 250° C. In a typical example, with acetylene ($C_2H_2$) as the source gas, a 13.56 MHz RF plasma is used, where the plasma was produced by capacitive discharge between two parallel plates 5 inches in diameter, having 1 inch spacing between the plates. Prior to the carbon deposition, the substrates are exposed for 45 minutes to an argon plasma in order to provide sputtered cleaning of the growth surface.

The rf power is set at 15 watts (corresponding to a surface power density of 110 mW.cm$^{-2}$). The total pressure is held constant at 30 microns, with a total gas flow set at 6 sccm. The substrate electrode is kept at a negative DC bias of about 150 VDC during deposition. The above process is continued for about 40 to about 400 minutes until the required thickness of about 0.2 to about 2 microns is achieved. The hard carbon layer is preferably about 0.2 to about 5 microns thick, more preferably about 0.2 to about 2 and most preferably about 0.5 microns thick.

In order to assure superior adhesion between the rigidizing layer (6) in FIG. 1 and copper substrate (8) in FIG. 1, especially when the rigidizing layer (6) in FIG. 1 is silicon, a layer (7) in FIG. 1 of a metal capable of forming a metal silicide is deposited on the copper substrate between the layer (6) in FIG. 1 and substrate (8) in FIG. 1. This layer (7) in FIG. 1 is about 50 to about 2000 angstroms thick. The metals employed include nickel, chrome, cobalt and/or titanium and preferably nickel. The metals can be deposited by any known technique such as sputtering and evaporation and preferably sputtering. Layer (7) is not needed to achieve superior adhesion when the rigidizing layer (6) is titanium nitride.

According to another aspect of the present invention, the non-graphitic hard carbon layer is employed as an anti-abrasive layer on copper devices such as inserts or pistons in contact with a semiconductor chip. Due to the thermal coefficient of expansion mismatch between cooling hardware and the chip substrate such as silicon, scratching can occur when the chip is powered on. The non-graphitic hard carbon layer prevents the copper from scratching and keeps the thermal resistance of the metal-chip interface from increasing. The devices, according to this aspect of the present invention, do not require the rigidizing layer (6), although if desired it can be included, but do require the layer (7) being of nickel, chrome, cobalt and/or titanium and preferably nickel in order to insure a tenacious bond of the carbon layer and copper. The layer (7) is typically about 50 to about 2000 angstroms thick and preferably about 500 to about 1500 angstroms thick.

The following non-limiting example is presented to further illustrate the present invention.

EXAMPLE

Onto the top surface (9) of a copper heat sink of the type illustrated in FIG. 2 is deposited a nickel layer about 1000 angstroms thick. The nickel layer is deposited by sputtering from a nickel target. Next an amorphous silicon layer about 4 microns thick is deposited on the nickel layer by plasma enhanced chemical vapor deposition from a mixture of 25% silane in argon. A non-graphitic hard carbon layer about 5000 angstroms thick is deposited on the silicon layer by plasma enhanced chemical vapor deposition from acelytene.

What is claimed is:

1. A device which comprises a copper substrate;
    a rigidizing layer about 2 to about 10 microns thick adhered to said copper substrate; and
    a non-graphitic hard carbon layer deposited on said rigidizing layer having a thickness of about 0.2 to about 5 microns wherein said non-graphitic hard carbon layer is electrically insulating and is thermally noninsulating.

2. The device of claim 1 wherein said rigidizing layer is selected from the group of silicon, titanium nitride, tungsten, tungsten carbide, aluminum nitride and mixtures thereof.

3. The device of claim 1 wherein said rigidizing layer is silicon.

4. The device of claim 3 wherein said rigidizing layer is titanium nitride.

5. The device of claim 1 which further includes a layer about 50 to about 1000 angstroms thick of a silicide forming metal selected from the group of nickel, chrome, cobalt and titanium and mixtures thereof, located intermediate said copper substrate and said rigidizing layer.

6. The device of claim 5 wherein said metal is nickel.

7. The device of claim 5 wherein said rigidizing layer is silicon.

8. An electronic package which comprises an integrated circuit chip and a heat sink in physical contact with the backside of said chip wherein said heat sink comprises
    a copper substrate;
    a rigidizing layer about 2 to about 10 microns thick adhered to said copper substrate; and
    a non-graphitic hard carbon layer deposited on said rigidizing layer and having a thickness of about 0.2 to about 5 microns and wherein said carbon layer contacts the backside of said chip, and wherein said non-graphitic hard carbon layer is electrically insulating and is thermally noninsulating.

9. The package of claim 1 wherein said rigidizing layer is selected from the group of silicon, tungsten, tungsten carbide, titanium nitride, aluminum nitride and mixtures thereof.

10. The package of claim 8 wherein said rigidizing layer is silicon.

11. The package of claim 10 wherein said rigidizing layer is titanium nitride.

12. The package of claim 8 which further includes a layer about 50 to about 1000 angstroms thick of a silicide forming metal selected from the group of nickel, chrome, cobalt and titanium intermediate said copper substrate and said rigidizing layer.

13. The package of claim 12 wherein said metal is nickel.

14. The device of claim 13 wherein said rigidizing layer is silicon.

15. A device which comprises a copper substrate;
a metal layer about 50 to about 1000 angstroms thick adhered to said copper substrate, wherein said metal layer is selected from the group of nickel, chrome, cobalt, titanium and mixtures thereof; and
a non-graphitic hard carbon layer deposited on said metal layer having a thickness of about 0.2 to about 5 microns, and wherein said non-graphitic hard carbon layer is electrically insulating and is thermally noninsulating.

16. The device of claim 15 wherein said metal is nickel.

17. The device of claim 15 wherein said metal layer is about 500 to about 1500 angstroms thick.

18. The device of claim 1 wherein the electrical resistance is at least 10 megaohms over a contact area of 0.5 $cm^2$ at a potential of about 10 volts (D.C.).

19. The package of claim 8 wherein the electrical resistance is at least 10 megaohms over a contact area of 0.5 $cm^2$ at a potential of about 10 volts (D.C.).

20. The device of claim 15 wherein the electrical resistance is at least 10 megaohms over a contact area of 0.5 $cm^2$ at a potential of about 10 volts (D.C.).

* * * * *